United States Patent [19]

Petty et al.

[11] Patent Number: 5,059,923
[45] Date of Patent: Oct. 22, 1991

[54] FRACTIONAL LOAD CURRENT DETECTOR

[75] Inventors: Thomas D. Petty; Robert L. Vyne, both of Tempe, Ariz.

[73] Assignee: Motorola Inc., Schaumburg, Ill.

[21] Appl. No.: 607,962

[22] Filed: Nov. 1, 1990

[51] Int. Cl.$^5$ ............................................... H03F 3/26
[52] U.S. Cl. ........................................ 330/273; 330/2
[58] Field of Search ................... 330/2, 267, 273, 288, 330/296; 307/350, 530

[56] References Cited

U.S. PATENT DOCUMENTS 4,356,452 10/1982 Iwamatsu ........................ 330/273 X
4,555,674 11/1985 Palara et al. ......................... 330/267

Primary Examiner—Steven Mottola
Attorney, Agent, or Firm—Michael D. Bingham

[57] ABSTRACT

A detection circuit including a first and second sensing circuits detects the presence of load current provided by a utilization circuit to which the detection circuit is coupled to provide an output current that is proportional to the load current. A fraction of the load current that is sourced from the utilization circuit flows through the first sensing circuit the latter of which then provides an output current proportional to the fractional load current. Similarly, a fraction of load current that is sunk by the utilization circuit flows through the second sensing means which provides an output current proportional to the fractional load current.

10 Claims, 1 Drawing Sheet

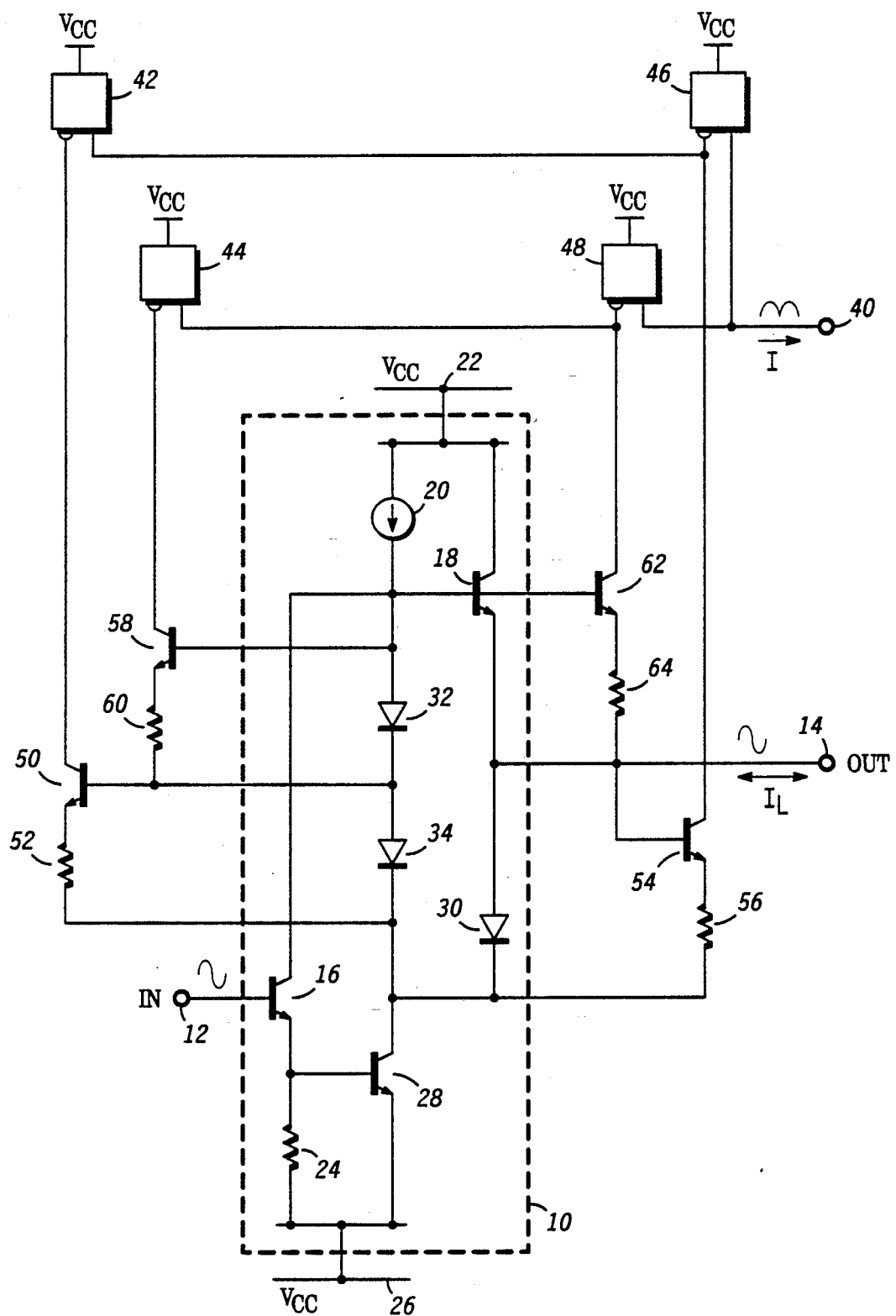

5,059,923

FRACTIONAL LOAD CURRENT DETECTOR

CROSS REFERENCE TO A RELATED APPLICATION

The subject application is related to a prior application filed on July 7, 1990, Ser. No. 558,927, by the same Assignee and entitled, "AMPLIFIER HAVING TWO OPERATING MODES".

BACKGROUND OF THE INVENTION

The present invention relates to current detectors and, more particularly, to a detector circuit for sensing current flow in an utilization circuit that provides load current therefrom and which is coupled to the detector circuit wherein the detector circuit provides a current output that is proportional to the load current.

Myriad of applications exists for detector circuits. One application of a current detector may be to control the operating state of high output current operational amplifiers. In present day applications it is a desired goal to produce amplifiers with low quiescent power consumption but such prior art amplifiers have been deficient in output drive current and alternating current (AC) performance. In fact, it is still desirous to provide an operational amplifier that has high drive current capability in order to drive low impedance loads while also having minimum bias drain current to reduce power consumption. Indeed, in portable battery powered applications such as mobile telephones, consumer entertainment systems e.g., radios and video games etc., it is especially important to limit the quiescent power consumption of amplifiers used in such applications.

Most, if not all, present day high output current operational amplifiers are comprised of an input stage that is coupled to an output stage. In response to an alternating input signal being applied to the input stage, the operational amplifier both sources and sinks drive current to and from a load coupled to the output stage. Typically, the input and output stages are biased to a quiescent drain current to permit quality audio and data processing applications. For example, low power, high output current amplifiers, such as the MC 33178 manufactured by Motorola, Inc., draw approximately 420 microamperes of drain current per amplifier in the quiescent operating mode with no input signal applied thereto. For micropower and battery powered applications there is a need to reduce drain current requirements over the foregoing while providing amplifiers that can supply high load currents. One manner in which the foregoing may be accomplished is to utilized circuitry for sensing when the input signal is below a certain threshold value to minimize the current drain of the amplifier and once the input signal exceeds this threshold to increase the bias to the stages so that the amplifier operates in its intended range. One method to do this is to sense the absence or presence of load current in the output stage of the amplifier. The absence of load current can then be detected to place the amplifier in a low quiescent bias current drain state. In response to detection of load current, due to an applied input signal, the bias current is then increased as described above.

Hence, there is a need for an improved method and circuit that can provide an output signal which may be utilized to control a load by providing a load control signal when a detected current exceeds a predetermined threshold value.

SUMMARY OF THE INVENTION

In accordance with the present invention there is provided a detection circuit that is coupled to an utilization circuit the latter of which provides a load current at an output thereof wherein the detection circuit detects the presence of the load current to provide an output signal that varies proportionally to the load current, the detection circuit including a first sensing circuit through which a fraction of the load current that is sourced from the utilization circuit flows for providing at an output of the detection circuit a current that is proportional to the fractional load current and a second sensing circuit through which a fraction of the load current that is sunk at the output of the utilization circuit flows for providing at the output of the detection circuit a current that is proportional to the fractional load current.

BRIEF DESCRIPTION OF THE DRAWING

The single FIGURE is a schematic diagram illustrating the present invention.

DETAILED DESCRIPTION OF THE PREFERRED EMBODIMENT

Turning to the FIGURE there is shown the detector circuit of the present invention coupled to a utilization circuit 10. For purposes of discussion, utilization circuit 10 is realized by the output stage of a conventional operational amplifier, for instance, the output stage of the aforementioned MC33178. It is understood that the load current detector of the invention is suited to be manufactured in integrated circuit form and could be incorporated onto the same integrated circuit comprising circuit 10.

If utilization circuit 10 is the output stage of an operational amplifier its input 12 would be coupled to the input and any intermediate stages of the amplifier such that a differential signal applied to the amplifier would result in an alternating signal applied to input 12 as is well known. Output stage 10 is considered as including emitter follower transistor 16 the collector of which is coupled to transistor 18 and whose base is coupled to input 12 while its emitter is returned to negative supply rail 26 via resistor 24 and to the base of transistor 28. The collector of transistor 28 is coupled to the cathode of diode means 30 while its emitter is coupled to rail 26. As understood, transistor 18 and diode means 30 along with transistor 28 form a push-pull output for sourcing and sinking current at output 14 of the amplifier during normal operation. Finally, output stage 10 includes diode means 32 and 34 series coupled between the base of transistor 18 and the collector of transistor 28 and to which current supply 20 is coupled thereto.

In normal operation output stage 10 is biased to a quiescent operating condition absent an applied input signal by a bias circuitry (not shown) such that a predetermined quiescent bias current flows from current source 20 through the devices thereof. In this quiescent operating state a voltage is developed across the bias stage consisting of diodes 32 and 34 that remains substantially constant during the operation of the output stage. Moreover, the voltage developed across diode means 30 and the base-emitter of transistor 18 is substantially equal to the voltage drop across diode means 32 and 34. In addition, in this state substantially no output current is either sourced or sunk at output 14.

The fractional load current detector circuit of the present invention comprises transistors 50, 54, 58 and 62; current mirrors 42, 44, 46 and 48 as well as resistors 52, 56, 60 and 64. More specifically, transistors 50 and 58 along with current mirror 42 and 44 and respective resistors, which are coupled with the bias stage comprising diode means 32 and 34, form a first sensing means as will be explained. Similarly, transistor 62, current mirror 48 and resistor 64 form a second sensing means and transistor 54, current mirror 46 and resistor 56 form a third sensing means.

Transistor 58 has its base and emitter, via resistor 60 coupled across diode means 32 and its collector coupled to the input of current mirror 44 the output of the latter being coupled to the input of current mirror 48. Transistor 50 is coupled in a like manner in that its base and emitter, via resistor 52, are coupled across diode means 34 while the collector of the transistor is coupled to the input of current mirror 42 with the output of the latter being coupled to the input of current mirror 46. During the quiescent operating state of the amplifier output stage the voltage across diode means 32 and 34 are equal to one another such that transistors 50 and 58 are biased to cause constant and equal current flow therethrough as the latter are identical as are the diodes. Hence, the input currents supplied respectively to current mirrors 42 and 44 will be equal as are the currents sourced from the outputs thereof. If diode means 32 and 34 are realized by using diode-connected transistor as understood, then by ratioing the emitter areas of transistors 58 and 50 to the emitter areas of diodes 32 and 34 will produce collector currents that are proportional to the current flowing through the diodes. For example, if the emitter area of diodes 32 and 34 are made N times the area of transistors 50 and 58 respectively, then the collector currents through the latter will be 1/N of the diode currents; where N is any positive number for small currents. Similarly, transistor 18 and diode 30 have emitter areas that are N times greater than the emitter areas of transistors 62 and 54 respectively and the currents through the latter two transistors will be less than the former.

Hence, in the quiescent operating state, diodes 32 and 34 provide a bias potential that appears across the base-emitter of transistor 18 and diode 30. Assuming that sensing transistors 50, 54, 58 and 62 are matched devices and that diodes 30, 32, 34 and transistor 18 are also matched and larger devices than the sensing transistors, the foregoing sensing transistors will all sink substantially equal collector currents. Thus, transistor 54 will sink all of the current sourced at the output of current mirror 42 such that there is no current sourced from the output of current mirror 46. Likewise, transistor 62 will sink all of the current sourced from the output of current mirror 44 such that there is no current sourced from the output of current mirror 48. Therefore, whenever the operational amplifier is in a quiescent state or when the alternating signal supplied at input 12 is at a zero cross over point, there is no output current sourced at the output 40 of the detector as the bias or background current is subtracted by the matched sensing devices.

As understood, responsive to an alternating differential input signal applied to input 12, transistor 28 will be turned on harder to sink current from output 14, via diode 30 and transistor 54 during one half of the alternating input signal, and will tend to be turned off during the other half of the alternating input signal while output transistors 18 and transistor 62 are turned harder on to source current to output 14. Assuming first that transistor 28 is turned on harder by transistor 16 being rendered conductive, transistor 18 will tend to be turned off as diode 30 is turned on. Load current is thus sank from output 14 through diode 30 which increases the voltage drop across the diode. This, in turn, causes sensing transistor 54 to be turned on to sink a fractional amount of the load current therethrough depending on the ratio of its emitter area with respect to the emitter area of the diode-connected transistor forming diode 30. However, the voltage drop across diodes 32 and 34 remains constant. Hence, transistor 54 is more conductive than transistor 50 and wants to sink more current than can be supplied from the output of current mirror transistor 42. This additional current is however supplied by current mirror transistor 46 wherein the sum of the currents supplied by current mirrors 42 and 46 to the collector of transistor 54 is equal to the fractional load current sunk by transistor 54. Current mirror 46 mirrors this current to supply a current, proportional to the fractional load current, to output 40 of the detector. In a like manner, on the alternating half cycle of the input signal to operational amplifier 10, transistor 18 is rendered more conductive in response to the input signal which causes transistor 62 to sink a fractional amount of the load current sourced to output 14. Transistor 62 will then want to sink more current than is supplied by current mirror 44. The additional current required by transistor 62 is supplied by current mirror 48. Thus, the fractional load current sunk by transistor 62 is then mirrored to output 40. The aforedescribed operation of current threshold detector is repeated on alternating half cycles of the input signal.

A significant feature of the detector of the present invention is that the current supplied from current source 20 can change substantially during the two operating states of the operational amplifier yet the load current can still be detected with a fractional proportion thereof being supplied to output 40. By subtracting out this background current it is the fractional load current that is detected.

What is claimed is:

1. A circuit for detecting current flow in a load utilization circuit the latter of which includes an output circuit for sourcing and sinking current at an output thereof and a bias circuit across which a substantially constant potential is developed, the circuit comprising:
   first sensing means coupled to the bias circuit for providing first and second output currents at respective first and second outputs the magnitudes of which are proportional to a current flowing through the bias circuit;
   second sensing means coupled to said first output of said first sensing means and being responsive to current being sourced from the output circuit for providing a current at an output of the circuit the magnitude of which is proportional to said current that is sourced from the output circuit; and
   third sensing means coupled to said second output of said first sensing means and being responsive to the output circuit sinking current for providing a current at said output of the circuit the magnitude of which is proportional to said sinking current.

2. The circuit of claim 1 wherein said first sensing means includes:
   a first transistor having first, second and control electrodes, said control electrode and said first electrode coupled to said bias circuit, said first transistor sinking a predetermined current;

a first current mirror having an input coupled to said second electrode of said first transistor and an output being said first output for sourcing a current thereat responsive to said current flowing through said first transistor;

a second transistor having first, second and control electrodes, said control electrode being coupled to said first electrode of said first transistor, said first electrode being coupled to the bias circuit, said second transistor sinking a predetermined current; and a second current mirror having an input coupled to said second electrode of said second transistor and an output being said second output for sourcing a current thereat responsive to said current flowing through said second transistor.

3. The circuit of claim 2 wherein said second sensing means includes:

a third transistor having first, second and control electrodes, said control electrode being coupled to the output circuit, said first electrode being coupled to the output of the output circuit, said third transistor being responsive to the output circuit for sourcing a portion of the load current to said output of the output circuit; and a third current mirror having an input coupled both to said output of said first current mirror and said second electrode of said third transistor and an output coupled to said output of the circuit, said third current mirror providing an output current to said output of the circuit the magnitude of which varies directly with the magnitude of said current sourced from said output of the output circuit.

4. The circuit of claim 3 wherein said third sensing means includes:

a fourth transistor having first, second and control electrodes, said control electrode being coupled to said output of the output circuit, said first electrode being coupled to the output circuit, said fourth transistor being responsive to the output circuit for sinking a portion of the load current at said output of the output circuit; and a fourth current mirror having an input coupled both to said second electrode of said fourth transistor and said output of said second current mirror and an output coupled to said output of the circuit, said fourth current mirror providing an output current to said output of the circuit the magnitude of which varies directly with the magnitude of said sinking current.

5. The circuit of claim 1 wherein said second sensing means includes:

a first transistor having first, second and control electrodes, said control electrode being coupled to the output circuit, said first electrode being coupled to the output of the output circuit, said third transistor being responsive to the output circuit for sourcing a portion of the load current to said output of the output circuit; and a first current mirror having an input coupled to said second electrode of said third transistor and an output coupled to said output of the circuit, said first current mirror providing an output current the magnitude of which varies directly with the magnitude of said current sourced from said output of the output circuit.

6. The circuit of claim 5 wherein said third sensing means includes:

a third transistor having first, second and control electrodes, said control electrode being coupled to said output of the output circuit, said first electrode being coupled to the output circuit, said fourth transistor being responsive to the output circuit for sinking a portion of the load current at said output of the output circuit; and a second current mirror having an input coupled to said second electrode of said fourth transistor and an output, said second current mirror providing an output current to said output of the circuit the magnitude of which varies directly with the magnitude of said sinking current.

7. A load current detector for detecting load current supplied from the output of an operational amplifier the latter of which includes an output stage for sinking and sourcing the load current at an output thereof and a bias stage including of a pair of series connected diodes, the detector comprising:

a first transistor having first, second and control electrodes, said control electrode and said first electrode being coupled respectively across the first one of said pair of diodes;

a second transistor having first, second and control electrodes, said control and said first electrode being coupled respectively across the second one of said pair of diodes;

a third transistor having first, second and control electrodes, said first electrode being coupled to the output of the operational amplifier and said control electrode being coupled to the output stage, said third transistor sinking a portion of the load current to said output;

a fourth transistor having first, second and control electrodes, said first electrode being coupled to output stage and said control electrode being coupled to the output of the operational amplifier, said fourth transistor sinking a portion of the load current at said output;

first circuit means having first and second terminals and an output, said first terminal being coupled to said second electrode of said first transistor, said second terminal being coupled to said second electrode of said third transistor and said output being coupled to an output of the detector, said first circuit means subtracting the current flow through said first transistor from the current flow in said third transistor to provide an output current that is proportional to the load current sourced to the output of the operational amplifier; and second circuit means having first and second terminals and an output, said first terminal being coupled to said second electrode of said second transistor, said second terminal being coupled to said second electrode of said fourth transistor and said output being coupled to the output of the detector, said second circuit means subtracting the current flow through said second transistor from the current flow in said fourth transistor to provide an output current that is proportional to the load current sunk at the output of the operational amplifier.

8. The detector circuit of claim 7 wherein said first circuit means includes:

a first current mirror having an input corresponding to said first terminal of said first circuit means and an output; and a second current mirror having an input and output, said input being coupled both to said output of said first current mirror and said second terminal of said first circuit means and said output corresponding to said output of said first circuit means.

9. The detector of claim 8 wherein said second circuit means includes:
   a third current mirror having an input corresponding to said first terminal of said second circuit means and an output; and
   a fourth current mirror having an input and an output, said input being coupled both to said output of said third current mirror and said second terminal of said second circuit means and said output corresponding to said output of said second circuit means.

10. The detector circuit of claim 9 including:
   a first resistor coupled in series with said first electrode of said first transistor;
   a second resistor coupled in series with said first electrode of said second transistor;
   a third resistor coupled in series with said first electrode of said of said third transistor; and
   a fourth resistor coupled in series with said first electrode of said fourth transistor.

* * * * *